US009557229B2

(12) United States Patent
Dumitru et al.

(10) Patent No.: US 9,557,229 B2
(45) Date of Patent: Jan. 31, 2017

(54) DYNAMIC STRAIN SENSOR AND METHOD (71) Applicant: HONEYWELL ROMANIA S.R. L., Bucharest (RO)

(72) Inventors: Viorel Georgel Dumitru, Prahova (RO); Stefan Dan Costea, Bucharest (RO); Ion Georgescu, Bucharest (RO); Mihai Brezeanu, Bucharest (RO)

(73) Assignee: Honeywell Romania s.r.l., Bucharest (RO)

( * ) Notice: Subject to any disclaimer, the term of this patent is extended or adjusted under 35 U.S.C. 154(b) by 0 days.

(21) Appl. No.: 14/564,362

(22) Filed: Dec. 9, 2014

(65) Prior Publication Data

US 2015/0177078 A1    Jun. 25, 2015

(30) Foreign Application Priority Data

Dec. 24, 2013    (EP) .................................... 13199570

(51) Int. Cl.
| | | |
|---|---|---|
| *H01L 29/84* | (2006.01) | |
| *G01L 1/16* | (2006.01) | |
| *H01L 27/20* | (2006.01) | |
| *H01L 41/35* | (2013.01) | |
| *H01L 41/29* | (2013.01) | |
| *H01L 33/32* | (2010.01) | |
| *H01L 41/187* | (2006.01) | |
| *H01L 41/113* | (2006.01) | |
| *G01L 1/26* | (2006.01) | |

(52) U.S. Cl.
CPC . *G01L 1/16* (2013.01); *G01L 1/26* (2013.01); *H01L 27/20* (2013.01); *H01L 33/32* (2013.01); *H01L 41/1132* (2013.01); *H01L 41/187* (2013.01); *H01L 41/29* (2013.01); *H01L 41/35* (2013.01)

(58) Field of Classification Search
CPC .............. G01L 1/16; G01L 1/26; H01L 27/20; H01L 33/32; H01L 41/1132
USPC ........................................................... 257/254
See application file for complete search history.

(56) References Cited

U.S. PATENT DOCUMENTS

| | | | |
|---|---|---|---|
| 4,991,150 A | 2/1991 | Wixom | |
| 2004/0062294 A1 | 4/2004 | Clemens et al. | |
| 2009/0127977 A1* | 5/2009 | So ....................... H01L 29/4908 | |
| | | | 310/322 |
| 2010/0117997 A1* | 5/2010 | Haase ................... H01L 27/156 | |
| | | | 345/204 |

(Continued)

FOREIGN PATENT DOCUMENTS

| | | |
|---|---|---|
| EP | 0087264 A2 | 8/1983 |
| EP | 2477019 A1 | 7/2012 |

OTHER PUBLICATIONS

"European Application Serial No. 13199570.6, Extended European Search Report mailed May 21, 2014", 3 pgs.

(Continued)

*Primary Examiner* — Matthew Gordon
(74) *Attorney, Agent, or Firm* — Schwegman, Lundberg & Woessner, P.A.

(57) ABSTRACT

A dynamic strain sensor includes a strain sensitive transistor and a light emitting diode coupled to the strain sensitive transistor. The dynamic strain sensor can include a piezoelectric layer incorporated into the structure of the strain sensitive transistor. The dynamic strain sensor can sense dynamic strain and can measure and monitor the dynamic strain wirelessly.

8 Claims, 4 Drawing Sheets

(56) References Cited

U.S. PATENT DOCUMENTS

2011/0049579 A1 3/2011 Dumitru et al.
2015/0378514 A1* 12/2015 Keski-Jaskari ...... H03K 17/964
345/178

OTHER PUBLICATIONS

"European Application Serial No. 13199570.6, Office Action mailed Jun. 11, 2014", 5 pgs.

"European Application Serial No. 13199570.6, Response filed Dec. 9, 2014 to Examination Notification Art. 94(3) mailed Jun. 11, 2014", 9 pgs.

Dahiya, Ravinder S., et al., "Piezoelectric oxide semiconductor field effect transistor touch sensing devices", *Appl. Phys. Lett.,* 95, 034105, (2009), 3 pgs.

Jia, Yanmin, et al., "Novel Mechano-Luminescent Sensors Based on Piezoelectric/Electroluminescent Composites", *Sensors,* 11, (2011), 3962-3969.

Someya, Takao, et al., "A large-area, flexible pressure sensor matrix with organic field-effect transistors for artifical skin applications", *Proc. Natl. Acad. Sci. USA* 101(27), (2004), 9966-9970.

\* cited by examiner

DYNAMIC STRAIN SENSOR AND METHOD

BACKGROUND

Dynamic strain sensors can be used in various industries to monitor and measure strain. For example, dynamic strain sensors can be used for monitoring the structural health of bridges, buildings, and industrial equipment. Additionally, dynamic strain sensors can be used for monitoring vibration of, for example, machine tools.

SUMMARY

The present disclosure is directed toward a dynamic strain sensor and a method for making the dynamic strain sensor. The dynamic strain sensor can incorporate a contactless monitoring method (e.g., visual method) for monitoring dynamic strain of large areas. The dynamic strain sensor of the present disclosure can be flexible such that the dynamic strain sensors can be used on various non-planar surfaces.

The dynamic strain sensors of the present disclosure can include a strain sensitive transistor including a piezoelectric layer integrated into the structure of the strain sensitive transistor. They dynamic strain sensors of the present disclosure can include a light emitting diode and the light emitted from the light emitting diode can be monitored for monitoring and measuring the dynamic strain. Further, the dynamic strain sensor can include the strain sensitive transistor that is used for adjusting the light emission from the light emitting diode.

The dynamic strain sensors can provide advantages over previous dynamic strain sensors. For example, dynamic strain sensors of the present disclosure can provide a contactless monitoring for monitoring dynamic strain of large areas and depending on the surface to be mounted, the sensors can be powered by a power supply or by a battery. The dynamic strain sensors can include a flexible substrate such that they can be used on various surfaces. Depending on the application, the dynamic strain sensor could be used for continuously monitoring the strain at different points along the surface on which the dynamic strain sensors are attached or only as threshold sensor. For instance, the dynamic strain sensor could be set such as the light emitting diode would be "on" (e.g., emitting light) only when the dynamic strain is above a threshold value of dynamic strain. Because the dynamic strain sensor uses a light emitting diode, the light emission signal can be adjusted in every kind of application to a desired intensity or wavelength by choosing the appropriate light emitting diode, thus, making the dynamic strain detection more convenient.

In an example, a dynamic strain sensor can include a strain sensitive transistor having a top surface. The strain sensitive transistor can include a substrate, a gate metal electrode coupled to the substrate, a piezoelectric layer, and a semiconductor layer, where the piezoelectric layer is positioned between the gate metal electrode and the semiconductor layer. The strain sensitive sensor including a light emitting diode coupled to the top surface of the sensitive transistor.

DETAILED DESCRIPTION OF THE DRAWINGS

The embodiments of the present disclosure will be described, by way of example only, by reference to the FIGS. 1-7 of the accompanying drawing in which.

DETAILED DESCRIPTION

As discussed herein, the present disclosure is directed to dynamic strain sensors and methods for making the dynamic strain sensors. The dynamic strain sensors of the present disclosure can provide a contactless, visual monitoring method for monitoring dynamic strain. The contactless, visual monitoring can be advantageous when the dynamic strain sensor is used for monitoring moving or rotary parts.

Figure 1:
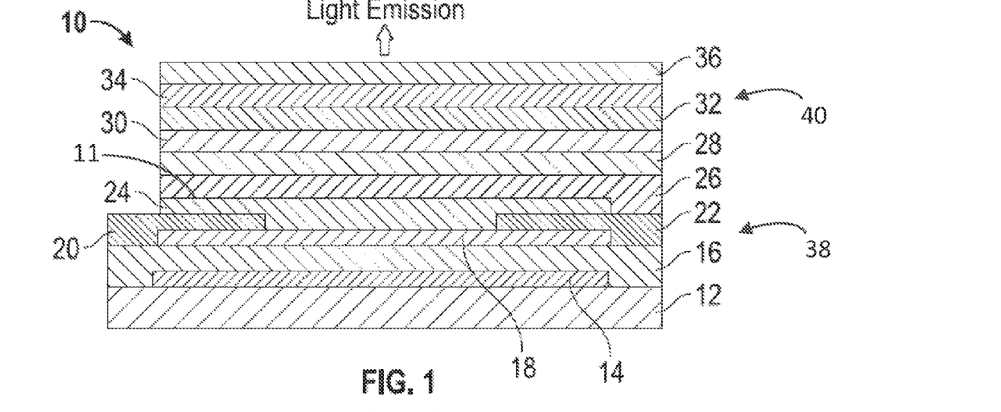
FIG. 1 shows a cross-sectional view of a dynamic strain sensor, in accordance with at least one example.

FIG. 1 shows a cross-sectional view of a dynamic strain sensor 10 (hereinafter also referred to as "sensor 10"), in accordance with at least one example. The sensor 10 can include a strain sensitive transistor 38 (hereinafter also referred to as "transistor 38") and a light emitting diode 40 (also referred to herein as "LED 40"). The light emitting diode 40 can be coupled to the transistor 38. The transistor 38 can include a piezoelectric layer 16 that can sense dynamic strain. When the sensor 10 is subjected to dynamic strain the piezoelectric layer 16 can generate an electric charge that can induce a change in the transistor 38 behavior (e.g., threshold voltage change,) and thus, change the current flowing through the transistor 38. In an example, The LED 40 can be electrically coupled to the transistor 38 such that the current flowing through the transistor 38 also flows through the LED 40. Thus, as the current flowing through the transistor 38 changes, an emission of light emitting from the LED 40 will also change as the sensor 10 is subjected to dynamic strain. That is, a LED light output can change in accordance with the dynamic strain experienced by the sensor 10. The emission of light (e.g., the LED light output) can be measured and monitored using a camera. Measuring and monitoring the emission of tight from the LED 40 with a camera can provide a visual, contactless wireless) method of measuring and monitoring dynamic strain. As discussed herein, the visual, contactless method and the flexibility of the sensor 10 can allow the sensor 10 to be used for monitoring vibration of rotary moving mechanical parts (shafts, turbine blades, etc.).

As shown in the example of FIG. 1, the transistor 38 can include a substrate 12, a gate metal electrode 14, the piezoelectric layer 16, and a semiconductor layer 18. For example, the substrate 12 can be chosen from plastic, metal, silicon, sapphire, silicon carbide, etc. In an example, the substrate 12 can be formed of a flexible material such that the sensor 10 can conform to non-planar surfaces. For example, the substrate 12 can be formed of PET, polyimide, or other flexible plastic sheet. The substrate 12 can be formed of flexible metallic sheet like aluminum, copper, molybdenum or stainless steel flexible sheets. In another example, the substrate 10 is not flexible. Suitable non-flexible materials that could be used as substrate include silicon, sapphire and silicon carbide. As discussed herein, the gate metal electrode 14 can be deposited onto a portion of the substrate 12. In an example, the gate metal electrode 14 can be chosen from aluminum, nickel, molybdenum, gold, and platinum.

In example, the substrate 10 can alternatively be realized by starting from a commercial substrate covered with a metal layer (could be a flexible substrate like ITOPET or metalized polyimide) that is patterned and etched in order to obtain the gate electrode.

As shown in the example of FIG. 1, the piezoelectric layer 16 can be positioned between the gate metal electrode 14 and the semiconductor layer 18. The piezoelectric layer 16 can be in contact with the gate metal electrode 14 and a portion of the substrate 12. In an example, the piezoelectric layer can be chosen from at least one of aluminum nitride and zinc oxide. When the sensor 10 is subjected to dynamic strain, the piezoelectric layer generates an electric charge that induces a change in the transistor behavior.

As shown in the example of FIG. 1, the semiconductor layer 18 can be positioned between the piezoelectric layer 16 and the gate metal electrode 14. The semiconductor layer 18 can include indium nitride (InN) and aluminum indium nitride (Al(x)In(1−x)N) deposited by sputtering or any of the other semiconductor materials used in the realization of thin film transistors, for example, amorphous silicon hydrogen (a-Si:H), indium gallium zinc oxide (InGaZnO), zinc oxide (ZnO) carbon nanotubes, and various nanowires used for nanowire field-effect transistors, etc.).

In an example, the sensor 10 can include a source metal electrode 20 and a drain metal electrode 22. The source metal electrode 20 and the drain metal electrode 22 can be chosen from aluminum (Al), titanium aluminum gold (Ti/Al/Au). The source metal electrode 20 and the drain metal electrode 22 make ohmic contact to the semiconductor layer 18. The source metal electrode 20 and the drain metal electrode 22 can be deposited such that they are in contact with a portion of the semiconductor 18 and a portion of the piezoelectric layer 16.

In an example, the sensor 10 can include an isolator layer 24. The isolator layer 24 isolate the LED 40 from the semiconductor layer 18 and the source metal electrode 20, such that the LED 40 can come into contact with only the drain metal electrode 22. As shown in the example of FIG. 1, the isolator layer 24 can be deposited on a portion of the semiconductor layer 18 and a portion of the source metal electrode 20 and a portion of the drain metal electrode 22. In an example, the isolator layer 24 can be chosen from silicon dioxide, aluminum oxide, aluminum nitride, and silicon nitride. In an example, the isolator layer 24 is silicon oxide.

As shown in FIG. 1, the LED 40 can be coupled to surface 11 of the isolator layer 24. In the example shown in FIG. 1 the surface 11 is atop surface of the isolator layer 24. In an example, the LED 40 in FIG. 1 is an organic light emitting diode. As shown in FIG. 1, the LED 40 can include a cathode layer 26, an electron transport layer 28, an active layer 30, a hole transport layer 32, an anode layer 34, and a transparent layer 36. The cathode layer 26 can connect the drain metal electrode 22 to the rest of the LED 40. As shown in the example of FIG. 1, the cathode layer 26 can be deposited on the surface 11 of the isolator layer 24 and a portion of the drain metal electrode 22, which can connect the drain metal electrode 22 to the rest of the LED 40. In an example, the cathode layer 26 can be chosen from aluminum and lithium fluoride.

In an example, the electron transport layer 28 can be chosen from a material known to be used as an electron transport layer in an organic LED. For example, the electron transport layer 28 can include, but is not limited to, tris(8-hydroxyquinlinato)aluminum (Alq3), (N,N'-Bis-(3-methylphenyl)-N,N'-diphenylbenzidine) (TPD) and pyrimido-pentaphenylbenzene (NPB). In an example, the active layer 30 can be chosen from material known to be used as an active layer in an organic LED. For example, the active layer 30 can include, but is not limited to, F8 with F8BT, PPV, MEH-PPV, MDMO-PPV, BCHA-PPV, poly[(1,4-phenylene-1,2-diphenylvinylene)], Poly(2,5-dialkoxy-1,4-phenyleneethynylene) (PPE), poly(1,4-phenylene) (PPP), Poly (2-decyloxy-1,4-phenylene), poly(9,9-dioctylfluorene), Poly (3-methyl-4-cyclohexylthiophene), and Polyquinoline. In an example, the hole transport layer 32 can be chosen from a material known to be used as a hole transport layer 32 in an organic LED. For example, the hole transport layer 32 can include, but is not limited to, poly (3,4-ethylenedioxythiophene) poly (styrenesulfonate) (PEDOT:PSS), pyrimido-pentaphenylbenzene (NPB), and (N,N'-Bis-(3-methylphenyl)-N,N'-diphenylbenzidine) (TPD). In an example, the anode layer 34 can include a material known to be used in an anode layer in an organic LED. For example, the anode layer 34 can include, but is not limited to, indium tin oxide. In an example, the transparent layer can include, but is not limited to, glass and single crystal sapphire.

In an example, when the sensor 10 is subjected to dynamic strain the piezoelectric layer 45 generates an electric charge that induces a change in the transistor behavior and hence the current flowing through the transistor 38 changes. In such a case, because the transistor current is flowing through the LED 40, which is coupled to the transistor 40, the light emission of the LED 40 will also change. The change of the light intensity of the LED emission can be measured and monitored using a camera.

Figure 2:
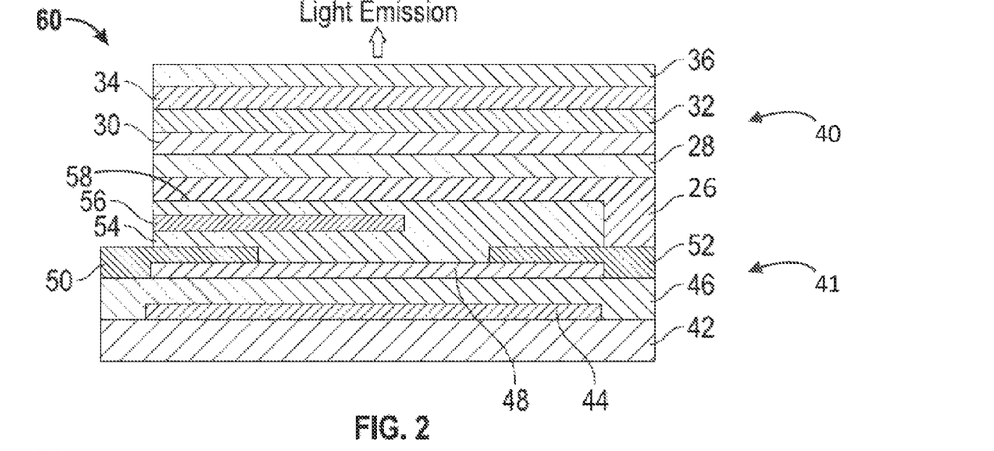
FIG. 2 shows a cross-sectional view of a dynamic strain sensor, in accordance with at least one example.

FIG. 2 shows a cross-sectional view of a dynamic strain sensor 40 (also referred to herein as "sensor 40"), in accordance with at least one example. Sensor 40 can include a strain sensitive transistor 41 (also referred to herein as "transistor 41") and the LED 40 as described herein with respect to FIG. 1. The transistor 41 is substantially the same as transistor 38, except that transistor 41 includes two metal gate electrodes 44 and 56 instead of just one (e.g., the metal gate electrode 14 as shown in FIG. 1) and includes an isolator layer 54 as part of the transistor 60. For example, the transistor 41 can include a substrate 42, a first metal gate electrode 44, a piezoelectric layer 46, a semiconductor layer 48, a source metal electrode 50, a drain metal electrode 52, the isolator layer 54, and the second metal gate electrode 56. The LED 40 can be coupled to the transistor 41. In an example, the isolator layer 54 can isolate the second metal gate electrode 56 and provide electrical separate for the cathode layer 26 of the LED 40, such that the LED 40 contacts a surface 58 of the isolator layer 54 and a portion of the drain metal electrode 52.

In an example, substrate 42 can be formed of the materials discussed herein for substrate 12, the first metal gate electrode 44 and the second metal gate electrode 56 can be formed of the materials discussed herein for the metal gate layer 14, the piezoelectric layer 46 can be formed of the materials discussed herein for the piezoelectric layer 16, the semiconductor layer 48 can be formed of the materials discussed herein for the semiconductor layer 18, the source metal electrode 50 and the drain metal electrode 52 can be formed of the materials as discussed herein for the source metal electrode 20 and the drain metal electrode 22, the isolator layer 54 can be formed of materials discussed herein for the isolator layer 24

Figure 3:
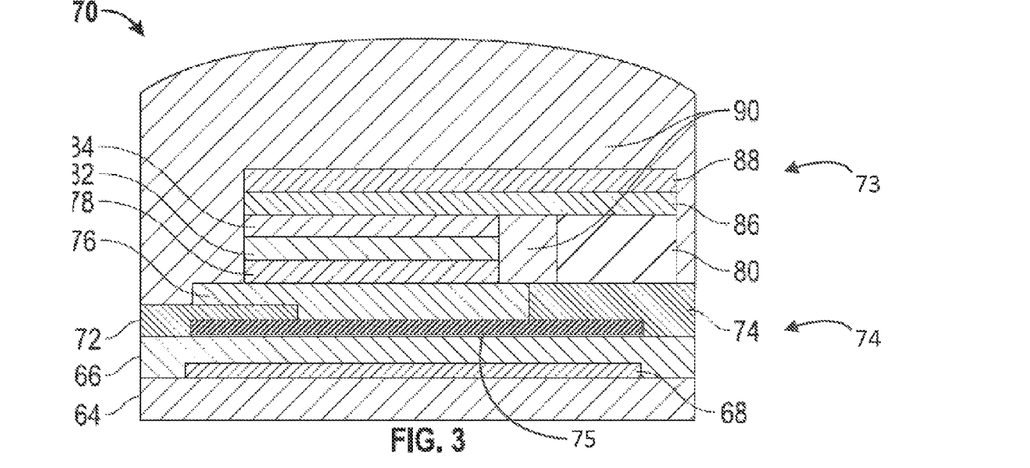
FIG. 3 shows a cross-sectional view of a dynamic strain sensor, in accordance with at least one example.

FIG. 3 shows a cross-sectional view of a dynamic strain sensor 70 (hereinafter also referred to as "sensor 70"), in accordance with at least one example. The sensor 70 can include a strain sensitive transistor 71 (hereinafter also referred to as "transistor 71 and a light emitting diode 73 (also referred to herein as "LED 73"). In the example shown in FIG. 3, the LED 73 is a gallium nitride based LED (GaN LED). The LED 73 can be coupled to the transistor 71. The transistor 71 can include a piezoelectric layer 66 that can sense dynamic strain. When the sensor 70 is subjected to dynamic strain the piezoelectric layer 66 can generate an electric charge that can induce a change in the transistor 71 behavior (e.g., threshold voltage change, bulk bias effect, etc.) and thus, change the current flowing through the transistor 71.

In an example, The LED 73 can be electrically coupled to the transistor 71 such that the current flowing through the transistor 71 also flows through the LED 73. Thus, as the current flowing through the transistor 71 changes, an emission of light emitting from the LED 73 will also change as the sensor 70 is subjected to dynamic strain. That is, a LED light output can change in accordance with the dynamic strain experienced by the sensor 70. The emission of light (e.g., the LED light output) can be measured and monitored using a camera. Measuring and monitoring the emission of light from the LED 40 with a camera can provide a visual, contactless (e.g., wireless) method of measuring and monitoring dynamic strain. As discussed herein, the visual, contactless method and the flexibility of the sensor 70 can allow the sensor 70 to be used for monitoring vibration of rotary moving mechanical parts (shafts, turbine blades, etc.).

The transistor 71 in FIG. 3 can include the substrate 64, a gate metal electrode 68, the piezoelectric layer 66, and a semiconductor layer 75. For example, the substrate 64 can be chosen from materials discussed herein for substrate 12. The gate metal electrode 68 can be deposited onto a portion of the substrate 64. In an example, the gate metal electrode 68 can be formed of materials discussed herein for gate metal electrode 44, as shown in FIG. 1.

As shown in the example of FIG. 3, the piezoelectric layer 66 can be positioned between the gate metal electrode 68 and the semiconductor layer 75. The piezoelectric layer 66 can be in contact with the gate metal electrode 68 and a portion of the substrate 64. In an example, the piezoelectric layer 66 can include materials discussed herein for piezoelectric layer 16, as shown in FIG. 1.

In an example, the sensor 70 can include a source metal electrode 72 and a drain metal electrode 74. The source metal electrode 70 and the drain metal electrode 72 can be deposited such that they are in contact with a portion of the semiconductor layer 75 and a portion of the piezoelectric layer 66. In an example, the source metal electrode 70 and the drain metal electrode 72 can be formed of materials discussed herein for source metal electrode 20 and drain metal electrode 22, as shown in FIG. 1.

In an example, the sensor 10 can include an isolator layer 76. As shown in the example of FIG. 3, the isolator layer 76 can be deposited on a portion of the semiconductor layer 75 and in contact with a portion of the source metal electrode 70 and a portion of the drain metal electrode 72. In an example, the isolator layer 24 can be formed of materials discussed herein for isolator layer 24, as shown in FIG. 1.

As shown in FIG. 3, the LED 73 can be coupled to the transistor 71. In the example shown in FIG. 3, the LED 73 is a GaN LED and can include a p-pad electrode 78, a p-layer 82, an active layer 84, a n-layer 86, a substrate 88, a n-pad electrode 80 and a protective epoxy 90. The p-pad electrode 78 can include nickel gold (Ni/Au. The p layer 82 (e.g., hole transport region) and the n-layer 86 (e.g., electron transport region) can include gallium arsenide phosphide (GaAsP), indium gallium nitride (InGaN), and gallium (III) nitride (GaN). The active layer 84 (where photons are generated by electron-hole recombination) can include indium gallium nitride. The substrate 88 can include sapphire and silicon carbide (SiC). The n-pad electrode 80 can include at least one of aluminum and titanium aluminum gold (Ti/Al/Au). In an example, the LED 73 and the transistor 71 can be connected with a silver paste.

Figure 4:
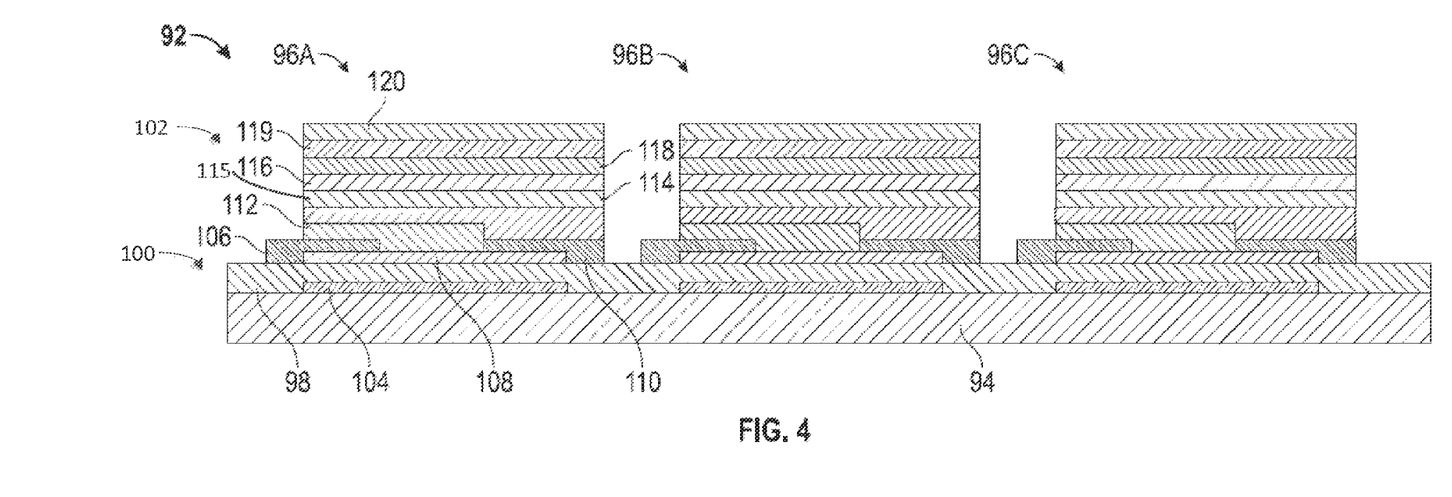
FIG. 4 shows a cross-sectional view of an array of dynamic strain sensors, in accordance with at least one example.

FIG. 4 shows a cross-sectional view of an array of dynamic strain sensors 92 (also referred to herein as the "array of sensors 92"), in accordance with at least one example. The array of sensors 92 can include a plurality of sensors 96A-C. The plurality of sensors 96A-C include a LED 102 and a strain sensitive transistor 100 (also referred to herein as "transistor 100"). The transistor 100 can include a substrate 94, a gate electrode 104, and a piezoelectric layer 98. As shown in FIG. 4, the plurality of sensors 96A-C can share a substrate 94 and the piezoelectric layer 98, while having a separate gate electrodes 104. However, in an example, the plurality of sensors 96A-C can also share a single gate electrode that extends across each sensor of the plurality of sensors 96A-C. The sensors, for example, sensor 96A can also include the semiconductor layer 108, a source metal electrode 106, and a drain metal electrode 110. The sensor 96A can include an isolator layer 112 which can isolate the cathode layer 115 of the LED 102 from the semiconductor layer 108 and the source metal electrode 106, while allowing the cathode layer 115 of the LED 102 to contact the drain metal electrode 110.

As shown in FIG. 4, the LED 102 is coupled to the transistor 100. The LED 102 in FIG. 4 is illustrated as an organic LED, however, the LED 102 can also be a GaN LED, as shown in FIG. 3. In an example when the LED 102 is an organic LED, the LED 102 can include the cathode layer 115, an electron transport layer 114, an active layer 116, a hole transport layer 118, an anode layer 119, and a transparent layer 120.

Figure 5:
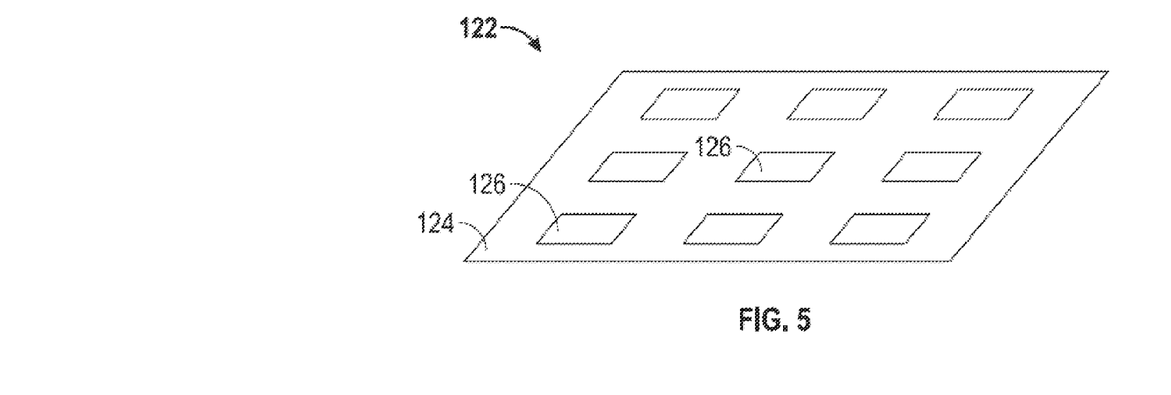
FIG. 5 shows a perspective view of an array of dynamic strain sensors, in accordance with at least one example.

FIG. 5 shows a perspective view of an array of dynamic strain sensors 122 (also referred to herein as "array of sensors 122"), in accordance with at least one example. As shown in FIG. 5, a plurality of sensors 126 can be deposited onto the substrate 124, such that each sensor of the plurality of sensors 126 shares the substrate. The substrate 124 can be flexible and can be coupled to non-planar surfaces to measure the dynamic strain. The array or sensors 122 can include sensors 10, 60, and 70, as illustrated in FIGS. 1, 2 and 3, respectively.

Figure 6A:
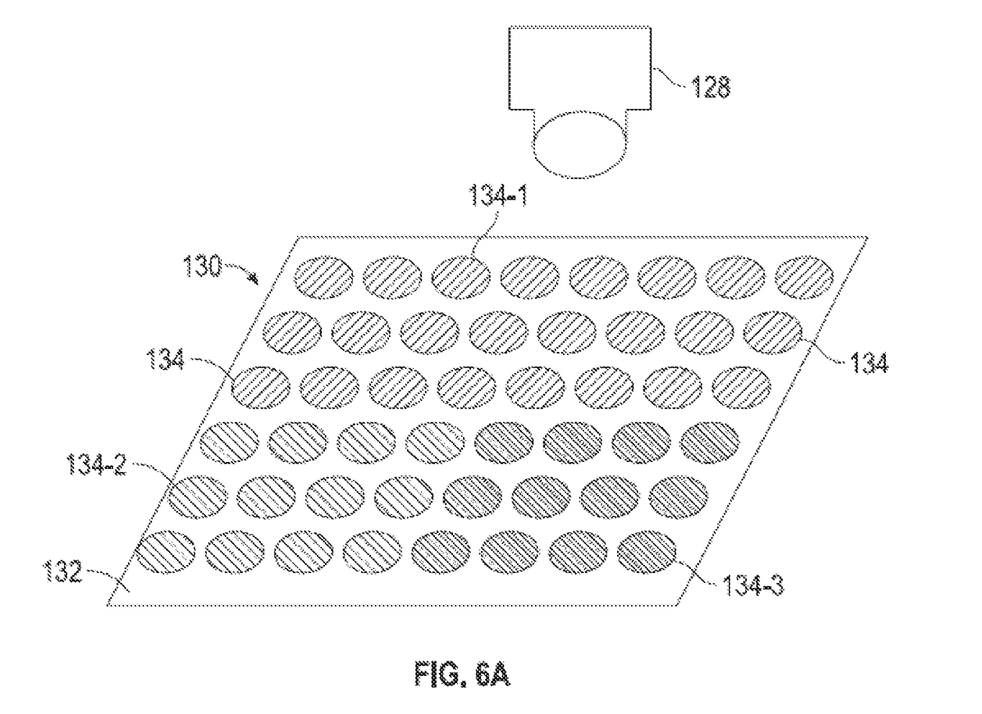
FIG. 6A shows a perspective view of an array of dynamic strain sensors and a camera, in accordance with at least one example.

FIG. 6A shows a perspective view of an array of dynamic strain sensors 130 (also referred to herein as "array of sensors 130"), and a camera 128, in accordance with at least one example. As shown in FIG. 6A, a plurality of sensors 134 can be deposited onto the substrate 132, such that each sensor of the plurality of sensors 134 shares the substrate. FIG. 6A illustrates how each of the sensors 134 can have a different light emission based on the amount of dynamic strain realized by the sensor 134. In one example, as the dynamic strain increases the light emission from the sensor 134 increases. For example, sensor 134-3 can be experiencing the most dynamic strain as it is emitting more light than compared to sensor 134-2 and sensor 134-1. The plurality of sensors 134 can include sensors 10, 60, and 70, as illustrated in FIGS. 1, 2 and 3, respectively.

Figure 6B:
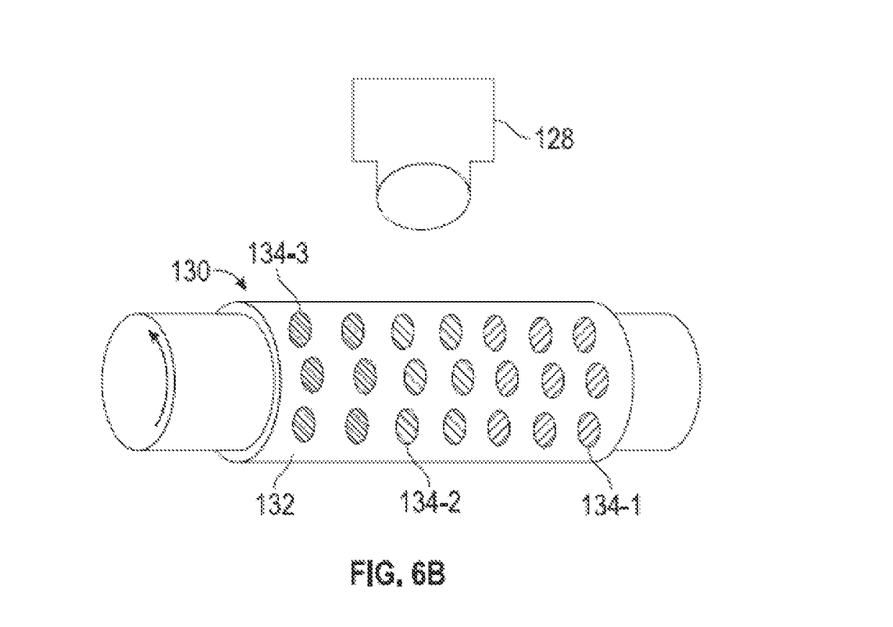
FIG. 6B shows a perspective view of an array of dynamic strain sensors and a camera, in accordance with at least one example.

FIG. 6B shows a perspective view of the array of dynamic strain sensors 130 and a the camera 128, in accordance with at least one example. In FIG. 6B, the substrate 132 (e.g., a flexible plastic sheet) has been attached to a rotating shaft. As discussed herein with respect to FIG. 6A, the sensor 134-3 is experiencing more dynamic strain than sensors 134-2 and 134-1. The camera 128 can monitor the intensity of the light emission and be configured to sound an alarm when the dynamic strain is greater than a threshold dynamic strain.

Figure 7:
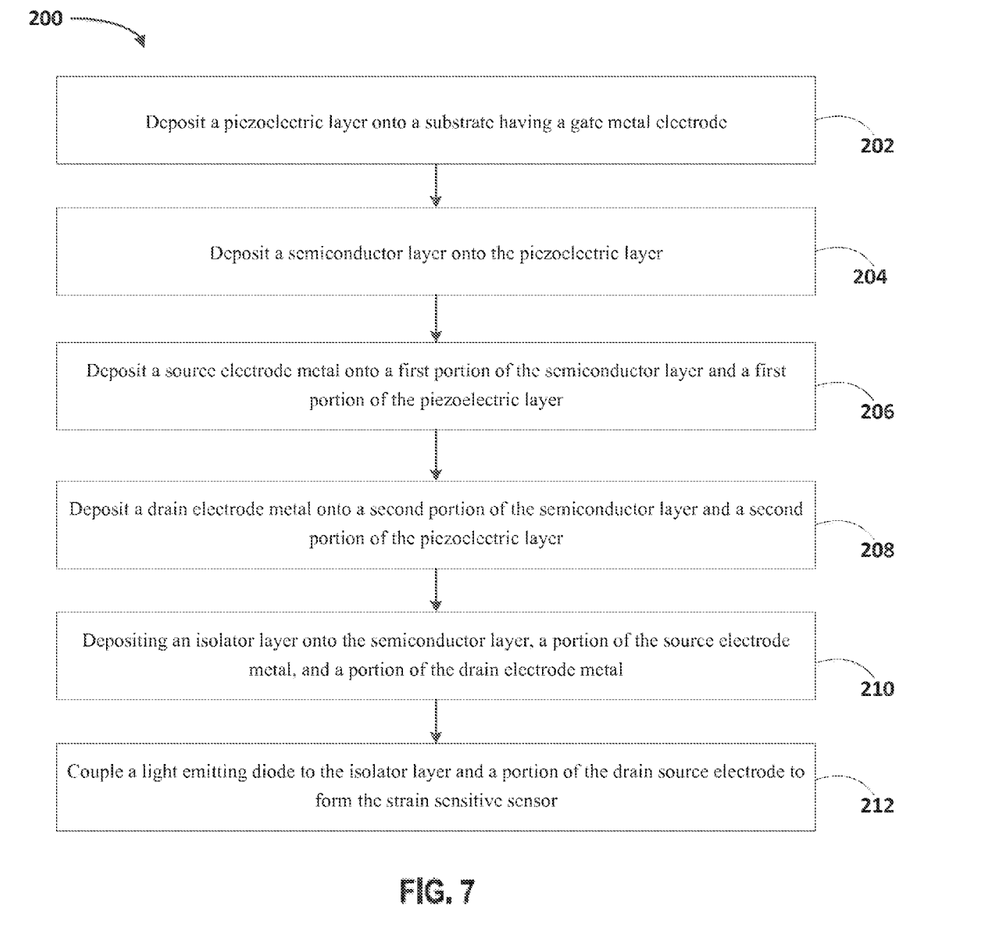
FIG. 7 shows a method of forming a dynamic strain sensor, in accordance with at least one example.

FIG. 7 shows a method 200 of forming a dynamic strain sensor, in accordance with at least one example. The method 200 can include, at step 202 depositing a piezoelectric layer onto a substrate having a gate metal electrode, at step 204 depositing a semiconductor layer onto the piezoelectric layer, at step 206 depositing a source electrode metal onto a first portion of the semiconductor layer and a first portion of the piezoelectric layer, at step 208 depositing a drain electrode metal onto a second portion of the semiconductor layer and a second portion of the piezoelectric layer, at step 210 depositing an isolator layer onto the semiconductor layer, a portion of the source electrode metal, and a portion of the drain electrode metal, at step 212 coupling a light emitting diode to the isolator layer and a portion of the drain source electrode to form the strain sensitive sensor.

At step 202, method 200 can include depositing a piezoelectric layer onto a substrate having a gate metal electrode. Depositing the piezoelectric layer onto the substrate can include depositing at least one of aluminum nitride and zinc oxide onto the substrate. Depositing the piezoelectric layer can be done by sputtering. In an example, the method 200 can include forming the substrate having the gate metal electrode. For example, forming the substrate having the gate metal electrode can include depositing the gate metal electrode onto the substrate. The gate metal electrode can be deposited via evaporation or sputtering using a shadow mask. In an example, the gate metal layer can be provided by starting from a commercial substrate covered with a metal layer (e.g., a flexible substrate like ITOPET and a metalize polyimide) that is patterned and etched in order to obtain the gate electrode. Thus, when the piezoelectric layer is deposited onto the substrate, the piezoelectric layer is in contact with the gate metal electrode and the substrate.

At step 204, the method 200 can include depositing a semiconductor layer onto the piezoelectric layer. Depositing a semiconductor layer can include depositing at least one of indium nitride, aluminum indium nitride, indium gallium zinc oxide, zinc oxide, and carbon nanotubes onto the piezoelectric layer.

At step 206, the method 200 can include depositing a source electrode metal onto a first portion of the semiconductor layer and a first portion of the piezoelectric layer. At step 208, the method 200 can include depositing a drain electrode metal onto a second portion of the semiconductor layer and a second portion of the piezoelectric layer. Depositing the source electrode metal and the drain electrode metal onto can be done via evaporation and sputtering using an appropriate shadow mask. While other depositions techniques can be used.

At step 210, the method 200 can include depositing an isolator layer onto the semiconductor layer and a portion of the source electrode metal and a portion of the drain electrode metal. Depositing the isolator layer can include depositing one of silicon dioxide, aluminum oxide, and aluminum nitride onto the semiconductor layer, a portion of the source electrode layer, and a portion of the drain electrode metal.

At step 212, method 200 can include coupling a light emitting diode to the isolator layer and a portion of the drain source electrode to form the strain sensitive sensor. In an example, coupling the light emitting diode includes coupling an organic light emitting diode. In an example, coupling the light emitting diode includes coupling a gallium nitride light emitting diode.

These non-limiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

EXAMPLES

Examples of the present disclosure provide dynamic strain sensors and methods of making the same.

Example 1 includes subject matter directed toward a dynamic strain sensor. The dynamic strain sensor includes a strain sensitive transistor and a light emitting diode. The sensitive transistor includes a substrate, a gate metal electrode coupled to the substrate, a piezoelectric layer, and a semiconductor layer, wherein the piezoelectric layer is positioned between the gate metal electrode and the semiconductor layer. The light emitting diode is coupled to the strain sensitive transistor.

In Example 2, the subject matter of Example 1 can be optionally configured such that the piezoelectric layer is chosen from at least one of aluminum nitride and zinc oxide.

In Example 3, the subject matter of Examples 1 or 2 can be optionally configured such that the semiconductor layer is chosen from at least one of indium nitride, aluminum indium nitride, indium gallium zinc oxide, zinc oxide, carbon nanotubes, amorphous silicon hydrogen, and nanowires.

In Example 4, the subject matter of Examples 1-3 can be optionally configured such that the strain sensitive transistor includes a source metal electrode, and a drain metal electrode.

In Example 5, the subject matter of Examples 1-4 can be optionally configured such that the semiconductor layer, the source metal electrode, and the drain metal electrode are positioned on a top surface of the piezoelectric layer.

In Example 6, the subject matter of Examples 1-5 can be optionally configured such that the gate metal electrode is a first gate metal electrode and the strain sensitive transistor comprises a second gate electrode.

In Example 7, the subject matter of Examples 1-6 can be optionally configured such that the light emitting diode is an organic light emitting diode.

In Example 8, the subject matter of Examples 1-7 can be optionally configured such that the light emitting diode is a gallium nitride light emitting diode.

Example 9 includes subject matter including a method of forming a strain sensitive sensor. The method can include depositing a piezoelectric layer onto a substrate having a gate metal electrode, depositing a semiconductor layer onto the piezoelectric layer, depositing a source electrode metal onto a first portion of the semiconductor layer and a first portion of the piezoelectric layer, depositing a drain electrode metal onto a second portion of the semiconductor layer and a second portion of the piezoelectric layer, depositing an isolator layer onto the semiconductor layer, a portion of the source electrode metal, and a portion of the drain electrode metal, and coupling a light emitting diode to the isolator layer and a portion of the drain source electrode to form the strain sensitive sensor.

In Example 10, the subject matter of Examples 1-9 can be optionally configured such that depositing the piezoelectric layer onto the substrate having the metal surface can include depositing at least one of aluminum nitride and zinc oxide onto the substrate.

In Example 11, the subject matter of Examples 1-10 can be optionally configured to include forming the substrate having the gate metal electrode In Example 12, the subject matter of Examples 1-11 can be optionally configured such that forming the substrate having the gate metal electrode includes depositing the gate metal electrode onto a plastic substrate via sputtering.

In Example 13, the subject matter of Examples 1-12 can be optionally configured such that depositing the semiconductor layer including depositing at least one of indium nitride, aluminum indium nitride, indium gallium zinc oxide, zinc oxide, carbon nanotubes, amorphous silicon hydrogen, and nanowires.

In Example 14, the subject matter of Examples 1-13 can be optionally configured such that coupling the light emitting diode to the isolator layer includes coupling an organic light emitting diode to the isolator layer.

In Example 15, the subject matter of Examples 1-14 can be optionally configured such that coupling the light emitting diode to the isolator layer includes coupling a gallium nitride light emitting diode.

What is claimed is:

1. A dynamic strain sensor comprising:
   a strain sensitive transistor, the strain sensitive transistor comprising:
   a substrate;
   a gate metal electrode coupled to the substrate;
   a piezoelectric layer;
   a semiconductor layer, wherein the piezoelectric layer is positioned between the gate metal electrode and the semiconductor layer;
   a source metal electrode in direct contact with a first portion of the semiconductor layer and a first portion of the piezoelectric layer; and
   a drain metal electrode in direct contact with a second portion of the semiconductor layer and a second portion of the piezoelectric layer;
   an isolator layer located on a third portion of the semiconductor layer, a first portion of the source metal electrode and a first portion of the drain metal electrode; and
   a light emitting diode coupled to and in direct contact with the isolator layer and a portion of the drain metal electrode of the strain sensitive transistor.

2. The dynamic strain sensor of claim 1, wherein the piezoelectric layer is chosen from at least one of aluminum nitride and zinc oxide.

3. The dynamic strain sensor of claim 1, wherein the semiconductor layer is chosen from at least one of indium nitride, aluminum indium nitride, indium gallium zinc oxide, zinc oxide, carbon nanotubes, amorphous silicon hydrogen, and nanowires.

4. The dynamic strain sensor of claim 1, wherein the semiconductor layer, the source metal electrode, and the drain metal electrode are positioned on a top surface of the piezoelectric layer.

5. The dynamic strain sensor of claim 1, wherein the gate metal electrode is a first gate metal electrode and the strain sensitive transistor comprises a second gate electrode.

6. The dynamic strain sensor of claim 1, wherein the light emitting diode is an organic light emitting diode.

7. The dynamic strain sensor of claim 1, wherein the light emitting diode is a gallium nitride light emitting diode.

8. The dynamic strain sensor of claim 1, wherein the isolator layer is chosen from silicon dioxide, aluminum oxide, aluminum nitride, and silicone nitride.

* * * * *